(12) United States Patent
Deleule

(10) Patent No.: US 7,120,886 B2
(45) Date of Patent: Oct. 10, 2006

(54) DEVICE FOR DETERMINING THE MASK VERSION UTILIZED FOR EACH METAL LAYER OF AN INTEGRATED CIRCUIT

(75) Inventor: Arnaud Deleule, Echirolles (FR)

(73) Assignee: STMicroelectronics, S.A., Montrouge (FR)

( * ) Notice: Subject to any disclaimer, the term of this patent is extended or adjusted under 35 U.S.C. 154(b) by 316 days.

(21) Appl. No.: 10/699,613

(22) Filed: Oct. 30, 2003

(65) Prior Publication Data

US 2004/0143805 A1 Jul. 22, 2004

(30) Foreign Application Priority Data

Oct. 31, 2002 (FR) .................................. 02 13651

(51) Int. Cl.
  G06F 17/50 (2006.01)
  G06F 19/00 (2006.01)
  H01L 23/485 (2006.01)
  H01L 23/528 (2006.01)

(52) U.S. Cl. .................... 716/10; 716/19; 700/115; 257/758

(58) Field of Classification Search ................ 716/10, 716/19; 700/116, 221, 225, 115; 326/38, 326/41, 47, 101; 257/758
See application file for complete search history.

(56) References Cited

U.S. PATENT DOCUMENTS

| | | | | |
|---|---|---|---|---|
| 5,399,505 A * | 3/1995 | Dasse et al. | .................. | 438/17 |
| 5,459,355 A | 10/1995 | Kreifels | ..................... | 257/758 |
| 5,504,369 A * | 4/1996 | Dasse et al. | ................. | 257/620 |
| 5,594,273 A * | 1/1997 | Dasse et al. | ................. | 257/620 |
| 5,654,588 A * | 8/1997 | Dasse et al. | ................. | 257/754 |
| 5,723,876 A | 3/1998 | Ray | ............................ | 257/48 |
| 5,787,012 A * | 7/1998 | Levitt | ............................. | 716/1 |
| 5,895,962 A * | 4/1999 | Zheng et al. | ............... | 257/529 |
| 6,190,972 B1 * | 2/2001 | Zheng et al. | ............... | 438/275 |
| 6,194,738 B1 * | 2/2001 | Debenham et al. | ........... | 257/48 |
| 6,365,421 B1 * | 4/2002 | Debenham et al. | ........... | 438/14 |
| 6,514,780 B1 * | 2/2003 | Manyoki | .................... | 438/18 |
| 6,559,544 B1 * | 5/2003 | Roth et al. | .................. | 257/758 |
| 6,570,254 B1 * | 5/2003 | DeForge et al. | ............ | 257/758 |
| 6,629,239 B1 * | 9/2003 | Steele, Jr. | .................... | 712/300 |
| 2001/0013658 A1 * | 8/2001 | Manyoki | .................... | 257/758 |
| 2002/0006676 A1 * | 1/2002 | Debenham et al. | ........... | 438/14 |

(Continued)

FOREIGN PATENT DOCUMENTS

GB  2 362 265  11/2001

(Continued)

*Primary Examiner*—Phallaka Kik
(74) *Attorney, Agent, or Firm*—Lisa K. Jorgenson; Jose Gutman; Fleit, Kain, Gibbons, Gutman, Bongini & Bianco P.L.

(57) ABSTRACT

A device for determining the version of metal mask utilized for producing a given metal layer (Metal3) in an integrated circuit including a plurality of metal layers (Metal0, ..., Metal3), and any modification made to the given metal layer (Metal3) requiring generation of a new version of the corresponding metal mask. The device includes a cell (Cell) integrated into the metal layer (Metal3) including at least a first voltage source (Vdd) for supplying a first voltage level, at least a second voltage source (GND) for supplying a second voltage level, and an output bus composed of at least one conductor wire (S1, S2) connected selectively to one of the first and second voltage sources as a function of the version of metal mask used to produce the metal layer, so as to generate a binary output signal representative of the mask version utilized.

24 Claims, 1 Drawing Sheet

U.S. PATENT DOCUMENTS

| | | | |
|---|---|---|---|
| 2002/0015898 A1* | 2/2002 | Sung et al. | 430/5 |
| 2002/0084331 A1 | 7/2002 | Reinschmidt et al. | 235/487 |
| 2003/0013025 A1* | 1/2003 | Tawara et al. | 430/20 |
| 2004/0064801 A1* | 4/2004 | Venkatraman et al. | 716/21 |
| 2005/0144582 A1* | 6/2005 | Venkatraman et al. | 716/10 |

FOREIGN PATENT DOCUMENTS

JP     11224278 A * 8/1999

* cited by examiner

DEVICE FOR DETERMINING THE MASK VERSION UTILIZED FOR EACH METAL LAYER OF AN INTEGRATED CIRCUIT

CROSS-REFERENCE TO RELATED APPLICATION

This application is based upon and claims priority from prior French Patent Application No. 02 13651, filed on Oct. 31, 2002, the entire disclosure of which is herein incorporated by reference.

BACKGROUND OF THE INVENTION

1. Field of the Invention

The present invention relates to a device enabling determination of the linking of version numbers of photo-engraving masks used in a production process of a chip, and especially of metal masks, automatic determination of the version numbers of the masks corresponding to each metal layer advantageously capable of being carried out from a software point of view. The invention therefore relates to the domain of microelectronics and more particularly that of producing chips generally designating any type of electronic component in integrated circuits.

2. Description of the Related Art

An integrated circuit is typically a multi-layered electronic device which comprises, for example, source/drain regions formed in a silicon substrate (transistor level), a layer of polysilicone for forming a grille region on the substrate (poly level), as well as a plurality of interconnection layers (metal levels). To produce each of these levels of an integrated circuit, one or more engraving masks are utilized in combination with standard photo-engraving techniques and chemical attack for transferring the respective units of each of the masks used at the level of the various layers of the integrated circuit. In particular, for producing complex integrated circuits, a large number of mask levels is required and all the engraving masks utilized to produce the complex integrated circuit form a given set of masks which is linked to the integrated circuit.

Each given integrated circuit is in fact provided with a version number to which the set of masks refers corresponding to the version of the integrated circuit. Each mask of the set of masks likewise has its own version number.

In effect, when an improved version of an existing integrated circuit must be produced, for example with the aim of correcting certain defects identified in the initial topology of the circuit, novel mask versions are generated for each level where one or more defects have been identified, so as to correct this. A new mask version is therefore inserted where the identified defect has been corrected in place of the existing defective mask in the initial set of masks, thus generating a new version of the integrated circuit. Attributed to each improved version of an integrated circuit is a new version number of the circuit with which a corresponding set of masks is associated. This version number is the simplest method of knowing the topology of the different layers of the integrated circuit as well as the abovementioned defects associated with each version of the integrated circuit.

Multiple mask versions can thus be generated from an initial topology of integrated circuit, so as to correct the defects identified in certain corresponding layers. These are essentially metal layers. Within the scope of the present invention, there will be greater interest taken in the metal mask levels, that is, the mask levels utilized to produce the interconnection layers.

The version number of the integrated circuit is usually indicated on the circuit housing, via serigraphy for example. Therefore, the version number can be accessible visually to allow the operator to determine the version of the chip and as a consequence the set of masks corresponding to the related mask versions.

However, when the housing of the chip is inserted for example, the information concerning the version number of the chip is no longer available.

Furthermore, in the modelling phase, the approach consisting of visually reading the version number of a chip on the casing of the chip can be a source of error due primarily to vague or imprecise documentation of the changes of mask required for each version change, or due to possible interpretation or incorrect identification by the operator of the adapted set of masks corresponding to each version.

Likewise, another disadvantage is that the version number of the chip engraved on the casing cannot be exploited from the software point of view, creating a handicap in the context of increased automation of administering and validating the different version numbers of each level of metal mask to be used for a given version of chip.

Also, for those chips comprising a ROM type memory layer, a solution consists of indicating the version number of the chip in a microprogram onboard the memory of the chip. If modifications are necessary to correct one or more defects identified on at least one level of metal mask, at least one new corresponding mask version is going to be generated and the microprogram is then also going to be modified so as to indicate the new version number of the chip. This microprogram can be interrogated by an external application by way of software resources, thus precisely identifying the version number of the chip and thus draw inferences from this concerning the administration of the defects to use for this version.

This solution does have certain disadvantages. In particular, in the case where there would be no defect at the microprogram level and where the correction to be made would be at the level of another metal layer, all the same it is necessary to generate a new microprogram onboard to reflect the new version number of the chip and, similarly, to generate a new corresponding mask version at the metal level to be corrected. This solution in this case thus implies changing two mask levels in place of a single one, which makes it costlier.

Another solution consists of administering the version number of the chip by coding it by a plurality of wires attached either to ground, or to the mains voltage, so as to create a binary code reflecting the version number of the chip.

However, the drawback to this solution is associated with its lack of flexibility. In effect, coding the version number of the chip is done first at a high level of modelling and then, the automatic placement routing tool which is going to make use of this coding will code the version number by distributing the wires on several layers. As a consequence, as the version number of the chip is coded on several layers, it is required to optionally regenerate several levels of metal mask if the modification to be carried out does not involve the layers where the version number of the chip is coded. Administering the version numbers of the chip is on the one hand fairly complex to put into practice and, on the other hand, onerous since it is necessary to intervene at the level of several layers to modify the code reflecting the version number.

Accordingly, there exists a need for overcoming the disadvantages of the prior art as discussed above.

SUMMARY OF THE INVENTION

A preferred embodiment of the present invention aims to provide a device allowing the version of different levels of metal mask used in the production of a given integrated circuit to be determined, at the same time eliminating the disadvantages of the prior art, that is, which allows the mask versions corresponding to each metal layer of the integrated circuit to be identified simply and automatically, by means of a single and unique software application.

Another aim of the invention is to reduce the manufacturing cost of integrated circuits.

To this end, an object of the present invention is a device for determining the version of metal mask utilized to produce a given metal layer in an integrated circuit comprising a plurality of metal layers, any modification made to the given metal layer requiring generation of a new version of the corresponding metal mask, the device comprising a cell integrated into the metal layer comprising at least one first source of power to supply a first level of voltage, at least one second source of voltage to supply a second level of voltage and an output bus, composed of at least one conductor wire connected selectively to one of the first and second voltage sources as a function of the version of metal mask used to produce the metal layer, so as to supply a binary output signal representative of the version of mask used.

According to a preferred embodiment, the output bus of the cell comprises two conductor wires.

Advantageously, the number of conductor wires making up the output bus of the cell is proportional to the number of versions of metal mask able to be used for the given metal layer.

Preferably, inside the cell, each conductor wire making up the output bus is routed close to the first voltage source and to the second voltage source so as to facilitate the connections and disconnections from one another. Preferably, the first voltage source comprises a supply terminal.

Preferably, the second supply source comprises a ground terminal.

The invention also relates to an integrated circuit comprising a plurality of metal layers, wherein each metal layer comprises the device according to the present invention as described hereinabove.

BRIEF DESCRIPTION OF THE DRAWING

Other characteristics and advantages of the present invention will emerge more clearly from reading the following description given by way of illustration and non-limiting and made with reference to the attached figures, in which.

DESCRIPTION OF THE PREFERRED EMBODIMENTS

Figure 1:
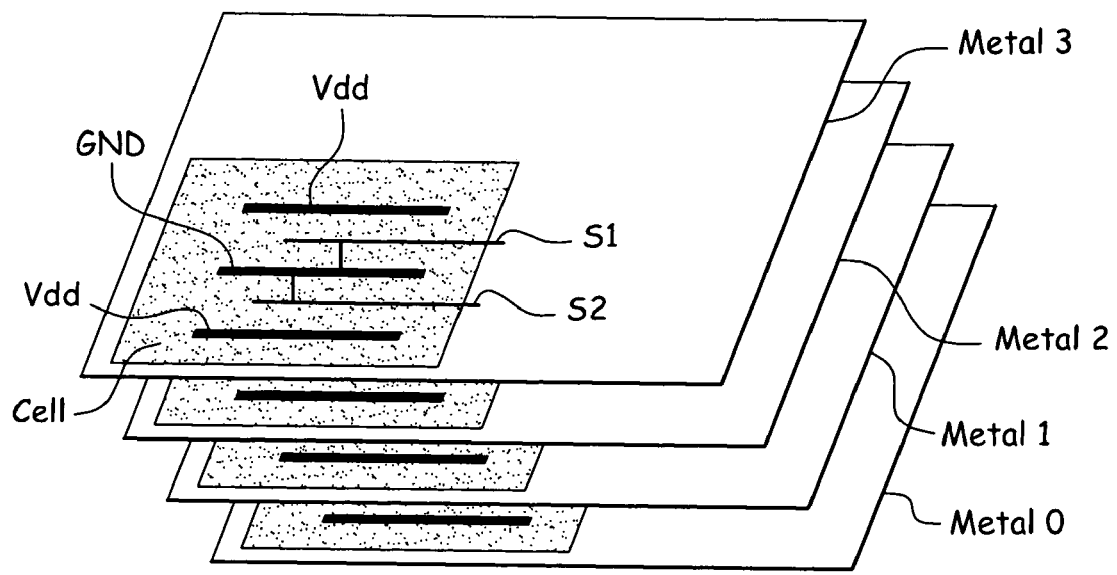
FIG. 1 shows a diagram of a metal layer integrating the device according to the present invention in a first configuration.

FIG. 1 accordingly shows a stack of metal layers, respectively Metal0, Metal1, Metal2 and Metal3, which form the interconnecting layers of an integrated circuit. Each of the metal layers Metal0 to Metal3 of the integrated circuit comprises a cell specifically dedicated to determining the version of the metal mask which has aided in manufacturing the corresponding metal layer.

Each cell comprises at least one output. In the example in FIG. 1, the cell comprises two output conductor wires S1 and S2 forming an output bus of the cell. Each cell also comprises at least one first voltage source in the form of a supply terminal so as to provide a first level of high voltage Vdd and at least a second source of voltage in the form of a ground terminal so as to provide a second level of low voltage GND. In the example in FIG. 1, each cell comprises successively, spread over the whole surface of the cell, a first supply terminal Vdd, a ground terminal GND and a second supply terminal Vdd, with the ground terminal placed between the two supply terminals. Inside the cell, the first conductor wire S1 is routed between the first supply terminal and the ground terminal, and the second conductor wire S2 is routed between the ground terminal and the second supply terminal.

Thus, inside the cell, each of the two conductor wires, respectively S1 and S2, is at the same time routed close to the supply terminal Vdd and to the ground terminal GND, so as to facilitate the connections and disconnections of the conductor wires S1 and S2 from one terminal to the other. The output signal of the cell results, in effect, from a preset combination of the connections of the conductor wires S1 and S2 to the supply terminal or to ground within each cell.

According to the above described embodiment, the output bus of the cell formed from the two conductor wires S1 and S2 thus enables a binary output signal coded on two bits to be supplied. Such an output signal coded on two bits effectively supports four distinct mask version numbers for a given metal layer, which refer to the different modifications necessary to successively eliminate several defects identified in the metal layer.

The number of conductor wires comprising the output bus of the cell is in fact determined proportionally as a function of the version numbers of desired metal mask for a given metal layer. At least one output conductor wire is necessary, thus allowing two mask version numbers to be coded.

The number of distinct mask versions which can be supported for a given metal layer is in fact given by the following equation:

$$\text{number of versions} = 2^{\text{number of conductor wires making up the output bus of the cell}}$$

In the initial state illustrated in FIG. 1, each metal layer has a zero version of its corresponding mask. In this configuration the two conductor wires S1 and S2 are connected to ground GND inside each cell of each metal layer Metal0 to Metal3. The two bits forming the output signal of each cell are thus at zero state, signifying that each metal layer has a zero version of its mask.

Figure 2:
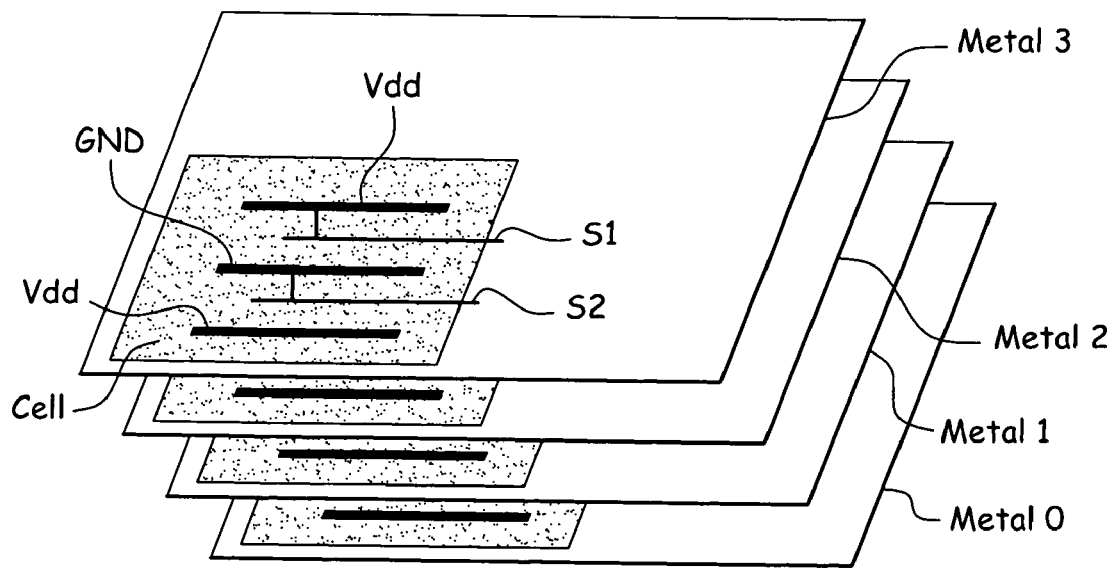
FIG. 2 shows a diagram of a metal layer integrating the device according to the present invention in a second configuration.

FIG. 2 illustrates the evolution relative to the initial configuration described in reference to FIG. 1. In the example in FIG. 2, the metal mask utilized to manufacture the layer Metal3 has been modified so as to eliminate a defect of the mask, corresponding to a defect identified on the layer Metal3 in its initial configuration. A new version of the mask, known as version 1, is then used to produce the metal layer3 of the integrated circuit. The other layers are not modified and retain the zero version of their corresponding production mask.

In this way, for the layers Metal0 to Metal2, the two bits of output of each corresponding cell remain in the zero state, indicating that these layers have a zero version of their mask. The two conductor wires constituting the output bus of each of the cells associated respectively with the layers Metal0 to Metal2 are thus always connected to ground GND.

As for the cell associated with the layer Metal3, its output signal is modified to reflect the change in version of the metal mask corresponding to the layer Metal3. To do this, when the mask Metal3 is changed, inside the cell, a new configuration of the connections of the wires S1 and S2 to the supply terminals and ground terminals is selected. Therefore, the conductor wire S1 is disconnected from the ground terminal GND to be connected to the supply terminal Vdd, and the connection of the conductor wire S2 to the ground terminal GND is not modified. The low-weight bit supplied by S1 passes to the state 1, while the heavy-weight bit supplied by S2 remains in the state 0. This new selection of the connections done inside the cell associated with the layer Metal3 is translated by a new combination of the output bits of the cell, which allows the new version number of the mask corresponding to the layer Metal3 to be coded. The mask is accordingly now in version 1. This version number is available at the output of the cell of the layer Metal3 by means of the output bus of the cell, which provides the binary code 0-1 representative of the version 1 of the mask utilized to manufacture the layer Metal3. Consequently, a possible new defect detected on the layer Metal3 can necessitate using a version 2 of the corresponding mask to correct it. In this case, when the mask is changed, a new binary code representative of the version 2 of the mask will be generated in output of the associated cell, for example the code 1-0. The low-weight bit S1 will then be reconnected to ground and the heavy-weight bit S2 will be disconnected from ground to then be connected to the mains.

The binary information obtained at the output of each cell associated with each metal layer of the integrated circuit can then be utilized by a microprogram of the integrated circuit to be supplied ultimately to a software application external to the integrated circuit. This binary information can also be processed and supplied directly to the external software application by way of material means. For example, with reference to the embodiment described in FIGS. 1 and 2, the two output bits of each cell associated respectively with the four metal layers Metal0 to Metal3, can be combined into a word of eight bits intended to be sent to the external software application. This word coded in eight bits is then representative of the mask version utilized for each metal layer Metal0 to Metal3 of the integrated circuit.

Therefore, by means of a single and unique software application, it is possible to determine simply and easily for a given integrated circuit, the mask version used for each metal layer of the integrated circuit and, consequently, the defects which have been corrected for each metal layer since each mask version for a given layer corresponds to one (or more) defect(s) which has/have been identified and corrected.

The present invention is not limited to the examples described above. Many alternative embodiments are possible without departing from the scope defined by the appended claims.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A device for determining a version of metal mask utilized for producing a given metal layer in an integrated circuit comprising a plurality of metal layers, wherein any modification made to the given metal layer requires generation of a new version of a corresponding metal mask, the device comprising:
   a cell integrated into a metal layer comprising:
   at least a first voltage source for supplying a first voltage level,
   at least a second voltage source for supplying a second voltage level, and
   an output bus comprising at least one conductor wire connected selectively to one of the first and second voltage sources as a function of a version of metal mask used to produce the metal layer, so as to generate a binary output signal representative of the version of metal mask utilized, wherein said binary output signal being independent from a binary output signal of, and representative of the version of metal mask utilized by, any other metal layer of the plurality of metal layers.

2. The device as claimed in claim 1, wherein the output bus of the cell comprises two conductor wires.

3. The device as claimed in claim 2, wherein a number of conductor wires is proportional to a number of versions of metal mask able to be utilized for the given metal layer.

4. The device as claimed in claim 1, wherein a number of conductor wires is proportional to a number of versions of metal mask able to be utilized for the given metal layer.

5. The device as claimed in claim 4, wherein the first voltage source comprises a supply terminal.

6. The device as claimed in claim 4, wherein the second voltage source comprises a ground terminal.

7. The device as claimed in claim 4, wherein inside the cells, each conductor wire is routed close to the first voltage source and to the second voltage source so as to facilitate connections and disconnections from one to the other.

8. The device as claimed in claim 1, wherein inside the cell, each conductor wire is routed close to the first voltage source and to the second voltage source so as to facilitate connections and disconnections from one to the other.

9. The device as claimed in claim 8, wherein the first voltage source comprises a supply terminal.

10. The device as claimed in claim 8, wherein the second voltage source comprises a ground terminal.

11. The device as claimed in claim 1, wherein the first voltage source comprises a supply terminal.

12. The device as claimed in claim 1, wherein the second voltage source comprises a ground terminal.

13. An integrated circuit comprising a plurality of metal layers, wherein each metal layer comprises:
   a cell integrated into the respective each metal layer, comprising:
   at least a first voltage source for supplying a first voltage level,
   at least a second voltage source for supplying a second voltage level, and
   an output bus comprising at least one conductor wire connected selectively to one of the first and second voltage sources as a function of a version of metal mask utilized to produce the respective each metal layer, so as to generate a binary output signal representative of the version of metal mask utilized, wherein said binary output signal being independent from a binary output signal of, and representative of the version of metal mask utilized by, any other metal layer of the plurality of metal layers.

14. The integrated circuit as claimed in claim 13, wherein the output bus of the cell comprises two conductor wires.

15. The integrated circuit as claimed in claim 14, wherein a number of conductor wires is proportional to a number of versions of metal mask able to be utilized for a given metal layer.

16. The integrated circuit as claimed in claim 13, wherein a number of conductor wires is proportional to a number of versions of metal mask able to be utilized for a given metal layer.

17. The integrated circuit as claimed in claim 16, wherein the first voltage source comprises a supply terminal.

18. The integrated circuit as claimed in claim 16, wherein the second voltage source comprises a ground terminal.

19. The integrated circuit as claimed in claim 16, wherein inside the cell, each conductor wire is routed close to the first voltage source and to the second voltage source so as to facilitate connections and disconnections from one to the other.

20. The integrated circuit as claimed in claim 13, wherein inside the cell, each conductor wire is routed close to the first voltage source and to the second voltage source so as to facilitate connections and disconnections from one to the other.

21. The integrated circuit as claimed in claim 20, wherein the first voltage source comprises a supply terminal.

22. The integrated circuit as claimed in claim 20, wherein the second voltage source comprises a ground terminal.

23. The integrated circuit as claimed in claim 13, wherein the first voltage source comprises a supply terminal.

24. The integrated circuit as claimed in claim 13, wherein the second voltage source comprises a ground terminal.

* * * * *